MAGNETIC SWITCHING DEVICE

Filed Nov. 30, 1956

INVENTOR.
RICHARD L. GARWIN
BY
Paul McEnlow
AGENT

3,339,165
MAGNETIC SWITCHING DEVICE

Richard L. Garwin, Scarsdale, N.Y., assignor to International Business Machines Corporation, New York, N.Y., a corporation of New York Filed Nov. 30, 1956, Ser. No. 625,512
48 Claims. (Cl. 338—32)

This invention relates to multiple state storage devices and more particularly to devices having superconducting elements for information storage and control purposes.

Various materials are described as being superconductive when they are cooled to a temperature in the vicinity of absolute zero (0° Kelvin) whereupon the electrical resistance of the material becomes equal to zero. Materials such as niobium, tantalum, tin, lead, vanadium, aluminum and titanium, for example become superconductive in the range of 0° K. to 8° K. The resistance of a superconducting material remains zero as a magnetic field is applied thereto until the field reaches a critical value, $H_c$. When the field is greater than the critical field value, the normal resistance of the material returns. The resistance reverts to zero when the field is lowered to a value less than $H_c$. The critical field value is a function of the characteristics and temperature of the material.

The prior art includes two state devices wherein the normal and superconductive states of a material exhibiting superconductive properties are utilized for information storage, gating, and control circuit logic. Such devices include a superconducting switching conductor and a control winding encompassing the conductor. The switching conductor is superconductive when the total magnetic field produced by the control winding and the current through the conductor is less than the critical field, and is rendered normal when the total field exceeds $H_c$, the critical field value. Thus, the current $I_c$ applied to the control winding is effective to control the current $I_s$ flowing in the switching conductor without regard to the polarity of either current. A plurality of these two state devices can be interconnected in various storage, computing and control circuit arrangements by utilizing the control current of one device as the switching conductor current of another, and vice versa. In this manner, a first two state device is capable of controlling one or more other such devices. The principal disadvantage of the two state superconductive devices known heretofore, is that the $L/R$ time constant is greater than those attainable with vacuum tubes and semiconductor devices. Hence, the switching time required to change the superconductive device from the superconductive to the normal state is many fold greater than the high switching speeds achieved in present day computers.

The present invention comprises a superconductive switch element capable of being changed from the superconductive to the non-superconductive or normal state by a magnetic field produced by a control element. A superconducting shield film is provided adjacent the switching element to confine the flux of said magnetic field to a smaller volume than normally occupied thereby. Accordingly, the superconducting shield film has the affect of substantially reducing the inductance L of the control element. The purpose of the control element is to produce a magnetic field which alters the state of the switch element between the superconductive and normal states without affecting the state of the superconducting shield film. The superconducting switching element is a thin film disposed adjacent the control element and the shield film. Since the cross sectional area of the thin film comprising the switching element is very small, the resistance thereof in the normal state is relatively large. Hence, the $L/R$ time constant of the present invention is very small which permits the utilization of the device as an active element in a high speed computer.

The planar shielded cryotron of the persent invention is shown and described but not claimed in copending application Ser. No. 615,814 entitled, "Superconducting Apparatus," filed in behalf of R. L. Garwin and assigned to the assignee of the present application.

It is a principal object of the invention to provide a novel superconducting device exhibiting a plurality of states and capable of being switched from one state to another at very high speeds.

Another object is to provide a novel multi-state superconductive device for use as a basic active electrical component of a high speed computer.

Another object is to provide a multi-state superconductive device having a switching time of the order of several millimicroseconds.

A further object is to provide a superconductive device comprising a switching element, a control element for controlling the conductivity of the switching element, and means for decreasing the inductance of the control element below the value thereof in free space.

Another object is to provide a superconductive device including a superconducting switching conductor, a control means for rendering the switching conductor nonsuperconductive by applying thereto a magnetic field, and means for restricting the field to a predetermined volume.

An additional object is to provide a two state superconductive device having a thermally conductive mandrel for conducting heat away from the device, a superconducting thin film surrounding the mandrel for excluding magnetic flux from the volume occupied by the mandrel, a second thin film surrounding the first film and having a lower critical field value and a high resistivity, and a helical coil surrounding the second film for controlling the conductivity of the latter by applying a magnetic field thereto, whereby the orientation of the components provide a device having a time constant of the order of a fraction of a microsecond.

A further object is to provide a novel multi-state superconductive device comprising a superconducting shield film oriented in a first plane, a superconductive switching conductor comprising a thin film of predetermined width and having a lower critical field value than said shield film and located in a second plane adjacent to the first plane, and a control conductor formed as a thin film having a smaller width than the switching conductor, said control conductor oriented in a plane adjacent to said second plane.

Another object is to provide a device for controlling a first current by a second current comprising a superconductive element having a superconductive and normal state for conducting the controlled current, a control conductor for conducting the control current to thereby alter the state of said element from the superconductive to the normal state, and further superconductive means for decreasing the inductance of the control conductor whereby the time interval required to alter the state of said superconductive element is substantially reduced with respect to the switching times of similar devices known heretofore.

An additional object is to provide a multi-state superconductive device comprising a plurality of thin films of various superconducting materials deposited, plated or evaporated on a mandrel.

A further object is to provide a high speed superconductive switching device comprising a plurality of thin films oriented in a plurality of adjacent planes whereby the device can be fabricated by vacuum-metalizing or printed-circuit techniques.

A still further object is to provide a superconductive device comprising a thin superconducting film having zero resistance in the superconducting state and a relatively large resistance per unit length in the normal state, a superconducting control element for applying a magnetic field to said thin film to render the latter normal, and a further superconducting thin film for confining said field so that the inductance of said control element is very small, whereby the L/R time constant of the device is in the millimicrosecond range.

A further object is to provide a multi-state superconductive device comprising a first superconducting thin film, having a width $W_s$ for conducting a current $I_s$, a second superconducting thin film having a width $W_c$ and oriented to traverse the longitudinal axis of a first film so that the application of a current $I_c$ to said second film renders a segment of said first film normal to present a resistance to the current $I_s$, and a third superconducting film disposed adjacent said first and second films, whereby the current gain of said device is approximately equal to the ratio of the widths, $W_s/W_c$.

Another object is to provide a multi-state superconductive device having a first superconductive ribbon of predetermined width, and a second superconductive ribbon narrower than said first ribbon for controlling the electrical characteristics of said first ribbon, said second ribbon arranged to traverse the axis of *n* segments of said first ribbon, whereby the normal resistance of said first ribbon is *n* times the resistance of each segment.

It is also an object to provide a multi-state superconductive device comprising a shield film fabricated of a superconducting material, a switching conductor fabricated as a thin film of superconducting material and having a predetermined resistance "*r*" per unit length, and control conductor for rendering a predetermined length of said switching conductor normal upon the application of a control current to the former, said control conductor being arranged adjacent to said switching conductor at "*n*" segments thereof, whereby the normal resistance of said switching conductor is equal to "*nr*" when a control current is applied to the control conductor.

Other objects of the invention will be pointed out in the following description and claims and illustrated in the accompanying drawings, which disclose, by way of example, the principle of the invention and the best mode, which has been contemplated, of applying that principle.

Figures 1, 2:
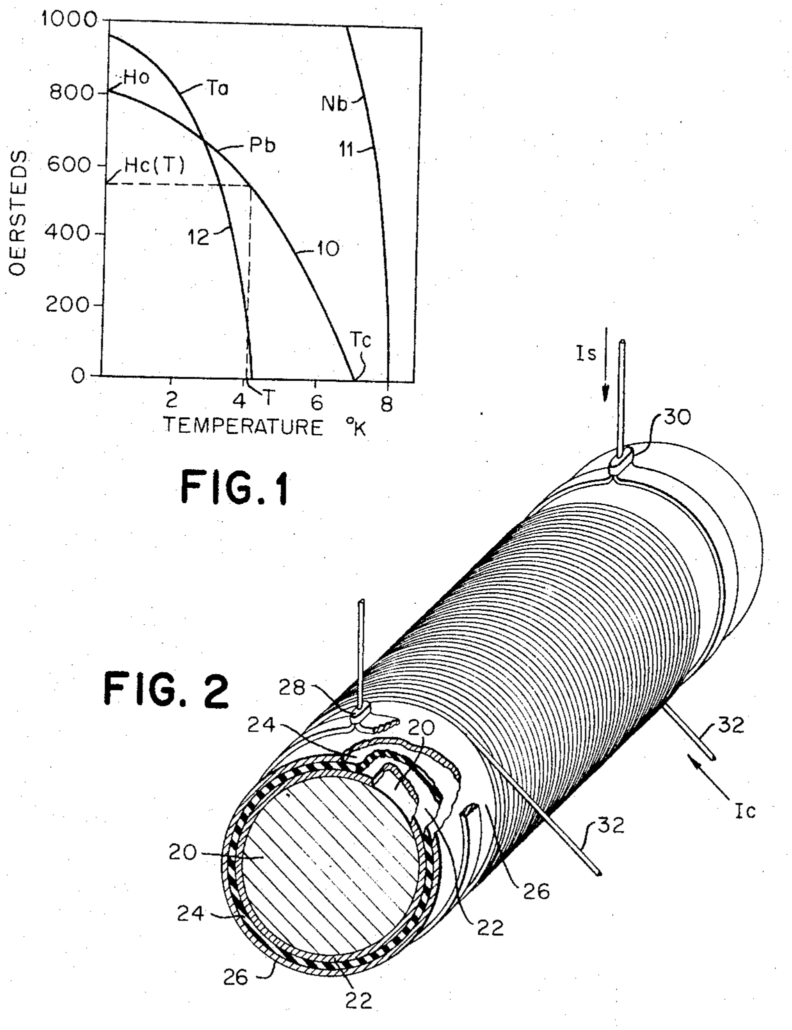
FIG. 1 is a plot of magnetic field vs. temperature for various superconducting materials.
FIG. 2 illustrates a circular embodiment of the invention.

Referring more particularly to FIG. 1, a graph of magnetic field strength vs. temperature is shown for several superconductive materials. The transition curves for lead, niobium and tantalum are shown as curves 10, 11 and 12 which characterize the important properties of these superconductive materials. A material is said to be in a superconductive state when the relationship between the magnetic field applied to the material and the temperature thereof is such that the intersection of these values lies in the area beneath the curve (FIG. 1) corresponding to the material. However, if either the temperature or the magnetic field surrounding the material is increased so that the intersection of the temperature and field values occurs in the area above the appropriate curve, the material is said to be in the "normal state." For any superconductive material, the graph of transition temperature as a function of magnetic field is substantially parabolic and levels out as absolute zero is approached. While only a partial plot of the transition curve for niobium is illustrated in FIG. 1, the curve thereof would approach absolute zero if the scale of the Y axis were increased to approximately three times the magnitude illustrated.

Consider for example, that the superconductive material is lead and is cooled to temperature T indicated in FIG. 1. The material exists in a superconductive state only if the field applied thereto is less than the value $H_c(T)$. If the strength of the magnetic field is increased above the value $H_c(T)$, the material is transformed to the normal conductive state. The field strength $H_c$ corresponding to a particular temperature at which the transition from the superconductive to the normal state occurs, is called the critical field. It is apparent therefore, that when the temperature of a superconducting material is maintained at a constant value, the increasing and decreasing of the strength of the field controls the resistance of the conductor by causing the properties thereof to shift back and forth between its superconducting and normal states, respectively. In order to control the conductive state of a superconducting material by controlling the magnetic field, the temperature thereof must be maintained at a value less than the transition temperature $T_c$ corresponding to zero magnetic field.

It should be noted that the field strength plotted in FIG. 1 represents the total field produced by the current flowing through the superconductive material and any externally applied field. The critical magnetic field $H_c(T)$ corresponding to a particular temperature limits the current which can be passed through the material without destroying the superconductive state. The field strength of the self field at the surface of a cylindrical conductor, due to the current flowing therethrough, is equal to $2I_o/10r$, where $r$ is the radius of the wire in centimeters and $I_c$ is the critical current corresponding to the critical field $H_c(T)$.

When several superconducting elements are operated in the same vicinity, they may be each reseponsive to different field strengths and thus the state of one element can be controlled by a magnetic field in the vicinity without affecting the superconductive state of other nearby elements having a higher critical field. Referring to curves 10 and 11 of FIG. 1, for example, it is clear that when the system is being operated at approximately 4° K., the critical field $H_c(T)$ sufficient to render a lead conductor normal, is insufficient to render a niobium conductor normal. This is true since the critical field for niobium at 4° K. is many times larger than the critical field for lead. Where various superconductive materials are utilized in the same vicinity and the materials have radically different critical field strengths, the material having the lower critical field is referred to as a "soft" superconductor, whereas the material having the greater critical field is referred to as a "hard" superconductor. In this connection, a magnetic field is generally applied to the system so as to render normal the "soft" superconductor without altering the superconductive state of the "hard" superconductor.

Frequently, a homogeneous alloy of two superconductive materials (or other compound superconductor) is used in order to provide a material having a predetermined critical field value. For example, a plot of the transition curve of tin would appear beneath curve 10 of FIG. 1. Thus a material having a predetermined intermediate critical field value can be formed by utilizing an alloy of tin and lead.

As explained hereinbelow, it is frequently desirable that a superconductive material exhibit a high resistance in its normal state. A higher resistance can be obtained by plating a superconductive material on a conducting plastic base. The increased resistance appears only when the material is normalized since it is shorted in the superconductive state by the zero resistance of the superconductive material. A high resistance may also be obtained by utilizing a thin film of superconducting material on an insulating base. The thin film may be evaporated or deposited by vacuum-metalizing techniques. Further, a high resistance may be obtained by removing the center of a superconducting conductor since the current in a superconducting element always flows in the surface thereof. Thus by plating or evaporating a thin film of lead, for example on an insulating core, a higher resistance in the normal state is obtained due to the decreased cross section of the superconductive material.

As described hereinbelow, information may be represented by the superconductive or normal state of a superconducting material. For example, an element exhibiting superconductive characteristics may be arbitrarily said to be representing a binary 0 when it is in a superconductive state and representing a binary 1 when the material is in the normal state. The information stored in a superconductive element can be determined by sensing the resistance of the element by any method well known in the art. If the material exhibits a zero resistance, it is of course, in the superconducting state, whereas when the material exhibits a resistance it is in the normal or non-superconducting state.

Further information concerning superconductive materials, theories of superconductivity and a synopsis of the experiments performed to date on superconductive materials may be found in the following references: D. Schoenberg, "Superconductivity," Second Edition, The Syndics of the Cambridge University Press, London, England, 1952; M. Von Laue, "Theory of Superconductivity," Academic Press, Inc., New York, N.Y., 1952; and D. A. Buck, "The Cryotron—A Superconductive Computer Component," Proceeds of the I.R.E., vol. 44, No. 4, pp. 482–493, April 1956. These references also include further references to literature relating to methods of obtaining temperatures near 4° Kelvin by apparatus using liquid helium or hydrogen.

Referring more particularly to FIG. 2, a novel gating device for controlling the superconductive state of a switching conductor fabricated from a superconductive material is illustrated. It should be understood that the entire device illustrated in FIG. 2 must be maintained at a temperature in the superconductivity range, which for example, may be between 2° K. and 5° K.

The device of FIG. 2 comprises a rod or mandrel 20 which serves as the core of the device. The rod 20 may be fabricated as a solid rod or as a hollow cylinder and may comprise an insulating material or thermally conductive material such as copper or tungsten. Preferably, the rod 20 should be copper so as to provide a thermal path for conducting heat generated within the structure to an external cooling medium. A thin film 22 of a hard superconducting material, such as lead or niobium for example, is deposited, plated or evaporated on the outer surface of rod 20. The thin film 22 must be fabricated of a material having a sufficiently high critical field value so that it always remains in the superconducting state. A thin film of insulating or dielectric material 24 is placed over the thin film 22.

Alternatively, the rod 20 may be omitted so that the device has an air core. In this event the film 22 must be made sufficiently thick to support the outer portions of the device described hereinbelow.

The switching conductor of the device of FIG. 2 comprises a thin film 26 formed over the layer of insulation 24. The film 26 is continuous and completely surrounds the periphery of the insulating layer. While the film 26 is shown as comprising a cylinder having a continuous surface, it is to be understood that any configuration may be utilized. For example, the film 26 may be provided with a plurality of longitudinal apertures so as to increase the resistance of the film in the normal state. In order to provide a switching conductor having a predetermined critical field value and also exhibit a high resistance in the normal state, the film 26 may comprise a homogeneous alloy of two superconductive materials, or may comprise a superconductive material such as tantalum, for example, mixed with a material having a high resistivity.

The switching conductor 26 is provided with connecting bands 28 and 30 which are respectively connected to the extremities thereof. The purpose of bands 28 and 30 is to make an electrical connection throughout the circumference of each extremity of conductor 26. However, other suitable connecting implements may be utilized without departing from the scope of the invention. Suitable leads for connecting the device of FIG. 2 in a circuit are attached to bands 28 and 30. As explained hereinbelow, the resistance of the switching conductor 26 between bands 28 and 30 will be zero when the conductor 26 is in the superconductive state and will be a predetermined value other than zero when the conductor is in the normal state.

A second layer of insulation or dielectric material similar to layer 24, may be formed over the periphery of switching conductor 26. However, if the winding 32 is fabricated of insulated wire, such a layer of insulation may be omitted.

A helical control winding 32 is fabricated to encompass the periphery of the switching conductor 26. The control winding is normally wound with a constant pitch, but the pitch thereof may be altered at various points throughout the length of the structure so as to produce a predetermined magnetic field surrounding the coil. The control winding 32 is fabricated of a "hard" superconducting material, such as niobium so that it always remains in the superconducting state. The reason that winding 32 is fabricated of a "hard" superconducting material is to eliminate power losses. If the coil is always superconductive, the resistance thereof is zero, and thus there are no power losses due to a current flowing therethrough. The conductor comprising coil 32 may be fabricated from a solid superconducting material or alternatively may comprise a niobium or lead-coated wire since current flows only in the surface of a superconducting material.

The control current $I_c$ is applied to the control winding 32 in order to create a magnetic field, the strength of which, must be greater than the critical field of the switching conductor 26, but less than the critical field of the film 22. Accordingly, when a control current $I_c$ is applied to control winding 32, conductor 26 is rendered normal so that the normal resistance thereof exists between terminals 28 and 30. Upon the cessation of current $I_c$, conductor 26 reverts to its superconducting state and the resistance disappears.

It is now apparent that by controlling the application of current $I_c$ to the control winding 32, the current $I_s$ flowing in switching conductor 26 may be controlled. When current $I_c$ is applied to the control winding, switching conductor 26 is rendered normal so that a voltage drop is produced between terminals 28 and 30 by current $I_s$.

When switching conductor 26 is transformed from the superconducting to the normal state by the application of current $I_c$, the resistance of conductor 26 suddenly appears and creates a power dissipation which causes heating of the device. This power dissipation is undesirable since it lowers the critical field at which the transition occurs and thereby limits the frequency at which switching conductor 26 can be changed from one state to the other. Undesirable heating effects are substantially reduced by fabricating the center rod of copper or other material having a high degree of thermal conductivity. The copper rod 20, for example, may be thermally connected to a refrigerant so as to conduct the power dissipated away from the device of FIG. 2.

The magnetic field which alters switching conductor 26 from its superconducting to its normal state, comprises the vector sum of the fields produced by current $I_s$ flowing through conductor 26 and current $I_c$ flowing through the control winding. The direction of the resultant field does not affect the speed with which the switching conductor may be transformed from one state to the other. Accordingly, the direction of the currents $I_s$ and $I_c$ are immaterial and need not be of any particular polarity.

The time constant of the device of FIG. 2 is $L/R$ where L is the inductance of the control winding and R is the resistance of the switching film 26. The time constant is substantially independent of the length of the storage device of FIG. 2 since as the length is increased, the resistance and inductance increase together.

In order to utilize the device of FIG. 2 in the storage and control circuits of a computer, for example, the time constant of the device must be very small. Thus, in order to provide a time constant of one microsecond or less, the storage device must be fabricated so as to have a minimum inductance and a maximum resistance.

One of the novel features of the storage device of FIG. 2, is the incorporation therein of a thin film 22 of a hard superconductive material. Since the flux of a magnetic field having a strength less than the critical field of a superconductive material cannot penetrate the surface thereof, the film 22 serves to confine the flux to the space existing between the film and the control winding 32. The confinement of a magnetic field to a volume less than it would normally occupy results in decreasing the inductance of the control winding 32. This is evident from the relationship stating that the magnetic energy, $LI^2/2$, of a field is equal to $H^2V/8\pi$, where H is the field density and V is the volume which the field occupies. Accordingly, by reducing the volume of the field, the inductance decreases so as to maintain the equality in the relationship described.

The time constant of the device of FIG. 2 is also decreased by increasing the resistance of switching conductor 26. The resistance of conductor 26 is made as large as possible by utilizing a thin film having a small cross sectional area. It is readily apparent that the normal resistance per unit length of the central conductor 26 is substantially larger than the resistance of a solid conductor of the same material having an identical diameter.

A practical embodiment of the superconductive device of FIG. 2 may be fabricated wherein the length of the control winding 32 and the distance between terminals 28 and 30 is approximately one centimeter. The copper mandrel 20 may be approximately $23\times10^{-3}$ centimeters in diameter, the superconducting shield film 22 may be approximately $1\times10^{-4}$ centimeters thick, the insulating film 24 may be approximately $3\times10^{-4}$ centimeters thick, and the switching film 26 may be approximately $5\times10^{-5}$ centimeters thick. Utilizing the above exemplary dimensions, the superconductive device of FIG. 2 will have an inductance of approximately $5\times10^{-9}$ henry. If the switching film 26 is composed of a homogeneous alloy of superconducting materials having a resistivity of approximately 50 micro ohm-cm., the resistance in the normal state will be approximately 20 ohms. Accordingly, the $L/R$ time constant of the device is approximately $2.5\times10^{-10}$ seconds. The above dimensions are recited as an example of a practical embodiment and are not to be considered as limiting the invention in any manner whatsoever.

The device of FIG. 2 exhibits a current gain since the self field produced by a current of a predetermined value flowing in the switching conductor 26 is substantially smaller than the field produced by the same current flowing in the control winding 32. Current gain is defined as the ratio of the current $I_s$ necessary to normalize the switching conductor to the current $I_c$ necessary to normalize the same switching conductor. This is evident from the fact that the self field is equal to $2I/10R$, whereas the field of the control winding is equal to $4\pi nI/10$, where "$n$" is the number of turns per centimeter of length of the control winding. Since the device of FIG. 2 exhibits a current gain, the current $I_s$ (flowing in switching conductor 26) may be utilized as the control current $I_c$ of another identical device. When utilized in this manner, a bistable storage device is formed. The switching conductor 26 of the first device is in the superconductive state, whereas the switching conductor of the second device is rendered normal by the current flowing through the control winding of the latter device. By connecting the switching conductor of the second device in series with the control winding of the first device, a second current path is formed which may be utilized to maintain the bistable element in a second stable state, that is, the switching conductor of the first device in the normal state and the switching conductor of the second device in the superconductive state.

While the storage device of FIG. 2 is illustrated as having a generally circular cross section, it is to be understood that the invention includes rectangular, square, elliptical and other cross sections which adhere to the relative placement of the components.

As an alternate method of construction of the device of FIG. 2, the control winding 32 may be formed by cutting or etching a layer of niobium into a spiral. In this embodiment, the device is constructed as shown, up to and including the forming of switching conductor 26 over the film of dielectric material 24. A second layer of insulation is then formed over the periphery of switching conductor 26. A film of niobium is deposited, plated or evaporated to form a coating over the second layer of insulation. The external layer of niobium is then etched or cut into a spiral to which appropriate connecting leads are applied. The spiral then becomes the helical control winding similar to winding 32. When using this method of construction, the device of FIG. 2 can be completely fabricated by plating, evaporating or depositing methods well known in the art.

Figure 3:
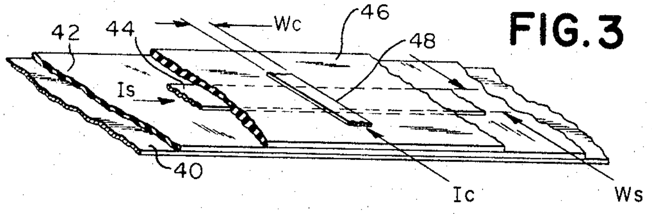
FIG. 3 illustrates a modified embodiment of the invention.

Referring more particularly to FIG. 3, a second embodiment of the invention is illustrated. The device of FIG. 3 functions in a manner similar to the device of FIG. 2, but is easier to fabricate due to the planar construction.

The planar device of FIG. 3 includes a backing plate 40 fabricated from a "hard" superconducting material such as lead or niobium and always remains in the superconducting state. As will be explained hereinbelow, the function of superconducting backing plate 40 is similar to that of the thin film 22 of FIG. 2.

A layer of insulation or dielectric material 42 (FIG. 3) separates the backing plate 40 from a conductive member 44. The conductive member 44 is formed of a thin film or ribbon of a "soft" superconductive material and functions in a manner similar to switching conductor 26 of FIG. 2. As will be explained hereinbelow, a portion of switching conductor 44 (FIG. 3) is rendered non-superconductive by the application thereto of a magnetic field having a strength greater than the critical field of the conductor. A current $I_s$ is applied to conductor 44. If conductor 44 is entirely superconducting, a voltage drop will not appear thereacross since the resistance of the conductor is zero. However, if a segment of the conductor has been rendered normal so that the resistance thereof re-appears, the current $I_s$ produces a voltage drop across the normalized portion.

A further film of insulation 46 is placed over conductor 44 so as to insulate it from conductor 48. Conductor 48 is then deposited, plated or evaporated over the surface of the layer of insulation 46.

Conductor 48 is fabricated of a "hard" superconducting material such as lead or niobium, for example, and always remains in the superconducting state. Conductor 48 is juxtaposed with conductor 44 and the superconducting surface 40 so that a magnetic coupling exists between conductors 44 and 48 at the point where the longitudinal axis thereof traverse each other. The conductor 48 is referred to herein as the control conductor and performs a function similar to the control winding 32 of FIG. 2. A control current $I_c$ is applied to control conductor 48 thereby producing a magnetic field around the conductor. The application of this field to switching conductor 44 causes a segment of the latter to be rendered non-superconductive, similar to the manner in which control winding 32 of FIG. 2 rendered switching conductor 26 non-superconducting.

It is now apparent that by selectively applying a control current $I_c$ to control conductor 48 of FIG. 3, the conductor 44 may be switched from the superconductive to the non-superconductive state. In other words, the current $I_c$ flowing through conductor 48 is effective to control the current $I_s$ flowing through conductor 44. The control conductor 48 is oriented so that the longitudinal axis thereof does not coincide with the longitudinal axis of conductor 44. The conductors 44 and 48 may be oriented in any manner whereby the field produced by conductor 48 couples and thus renders non-superconductive a segment of conductor 44.

The switching or gating device of FIG. 3 exhibits a current gain which is approximately equal to the width of the switching conductor divided by the width of the control conductor, that is, $W_s/W_c$. Current gain of the device of FIG. 3, is defined in the same manner as set forth hereinabove with respect to the device of FIG. 2. Accordingly, if the width $W_c$ of the control conductor is very small compared to the width $W_s$ of the controlled conductor, a very large current gain may be obtained. For example, if $W_s$ is approximately $1\times10^{-2}$ centimeters and $W_c$ is $2\times10^{-3}$ centimeters, a current gain of 5 is obtained.

As stated above, the application of the magnetic field produced by control conductor 48 renders a segment of switching conductor 44 normally conductive so that the resistance thereof re-appears. The normalized portion of conductor 44 exists only in the vicinity where control conductor 48 traverses conductor 44. Thus the resistance which appears in series with the length of conductor 44 is merely the resistance of the length of the segment which is normalized. In order to increase the resistance which re-appears in conductor 44, the control conductor 48 may be formed so as to cross the longitudinal axis of conductor 44 several times. Such an embodiment is illustrated in FIG. 4.

Figure 4:
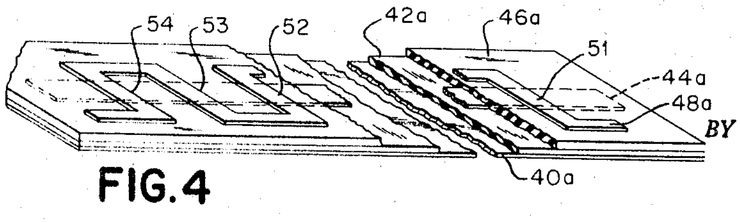
FIG. 4 illustrates a planar embodiment of the invention.

Referring to FIG. 4, a further embodiment which incorporates the principle of FIG. 3 is illustrated. In order to correlate the components of FIG. 4 with the corresponding components of FIG. 3, similar reference characters having the suffix "*a*" are provided.

The device of FIG. 4 is constructed identically to the device of FIG. 3, up to and including the second film of insulation 46*a*. The control conductor 48*a* is fabricated as a narrow ribbon conductor having a width $W_c$ which traverses the longitudinal axis of and thus is magnetically coupled to the switching ribbon conductor 44*a* at a plurality of points. Accordingly, when a control current $I_c$ is applied to control conductor 48*a*, the segment of conductor 44*a* immediately beneath point 51 is rendered non-superconductive. Similarly, the segments of the controlled conductor 44*a* at points 52, 53 and 54 are normalized by the magnetic field produced by current $I_c$. If the resistance which apppears at point 51 of conductor 44*a* is equal to $R_1$, and a similar resistance occurs at each of the points 52, 53 and 54, for example, the total resistance which appears in conductor 44*a* is equal to $nR_1$, where "*n*" is the number of times that conductor 48*a* traverses the axis of conductor 44*a*.

A practical embodiment of the superconductive device of FIG. 4 may be fabricated utilizing the following dimensions. However, it is to be understood that these dimensions are given by way of example and are not intended to limit the scope of the invention in any manner whatsoever. The switching conductor 44*a* may be a thin film approximately $1\times10^{-4}$ centimeters thick and $1\times10^{-2}$ centimeters wide. The control conductor 48*a* may comprise a thin film approximately $1\times10^{-4}$ centimeters thick and approximately $2\times10^{-3}$ wide. The film of insulation 46*a* existing between conductors 44*a* and 48*a* may be approximately $3\times10^{-4}$ centimeters thick. The distance between adjacent segments of control conductor 48*a*, i.e., the distance between points 53 and 54, for example, may be $1\times10^{-2}$ centimeters.

By utilizing the structure of FIG. 4, a storage device having a small time constant can be fabricated. The time constant of the circuit is $L/R$, where L is the inductance of the control conductor 48*a* and R is the resistance of switching conductor 44*a* when normalized. Since the control conductor 48*a* traverses conductor 44*a* several times, the total resistance R is increased. As explained hereinabove, by confining the magnetic field produced by control conductor 48*a* to a very small volume, the inductance thereof is decreased over the value it would be if the conductor were oriented in free space. Since the backing plate 40*a* of FIG. 4 and the backing plate 40 of FIG. 3 are fabricated of a "hard" superconducting material so as to always remain in the superconducting state, the flux produced by the magnetic field cannot penetrate the surface of the backing plate. Accordingly, the magnetic field applied to conductor 44*a* of FIG. 4, for example, is confined by the backing plate with the result that the inductance of control conductor 48*a* is substantially decreased.

The backing plate 40 of FIG. 3 and 40*a* of FIG. 4 is not essential to the basic operation of the device, but the inclusion thereof greatly increases the switching speed as explained hereinabove. Thus, where slower switching speeds are permissible, the backing plate may be omitted without departing from the scope of the invention.

A plurality of devices similar to that of FIG. 4 may be fabricated on a single backing plate and that a plurality of such backing plates may be stacked vertically so as to provide a large number of such devices in a relatively small volume. By this arrangement, the entire structure may be submerged in a liquid helium bath to obtain the required operating temperature, or may be compactly incorporated in a low temperature refrigerator.

While there have been shown and described and pointed out the fundamental novel feature of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A two-state device comprising, an inner superconducting surface, an outer superconducting surface surrounding said inner surface, and a conductive member formed as a helical coil surrounding said outer surface for rendering said outer surface non-superconductive by applying a magnetic field thereto, whereby said field is confined to the exterior surface of said inner superconducting surface.

2. A gating device comprising, a first superconducting member, a second superconducting member encompassing said first member and having a lower critical field value than said first member, and a superconducting helical coil surrounding said second member for applying thereto a magnetic field to render said second member non-superconductive, whereby said field is confined to a predetermined volume by said first member to thereby decrease the inductance of said coil.

3. A two-state device comprising a cylindrical member, a first superconducting thin film disposed on the periphery of said member for excluding any magnetic field from said cylindrical member, a thin layer of dielectric material disposed on the surface of said first film, a second superconducting thin film disposed on the periphery of said dielectric material, and means for rendering said second film nonsuperconductive by applying a magnetic field thereto.

4. Apparatus for representing information by either of two electrical states comprising, a first thin-wall cylinder fabricated from material maintained in the superconducting state, a thermal conductor encompassed by said cylinder for supporting the latter and for conducting heat therefrom, a second thin-wall cylinder encompassing said first cylinder and capable of being transformed from the superconductive to the non-superconductive state, and a helical coil surrounding said second cylinder for selectively applying a magnetic field thereto to thereby cause said second cylinder to exist in the superconducting or non-superconducting state, said first cylinder serving to exclude said magnetic field from the volume occupied by said thermal conductor thereby decreasing the time required to alter the state of said second cylinder.

5. A superconducting switching device comprising, a first superconducting conductor, a second superconducting conductor magnetically coupled only at predetermined locations to said first conductor, means for selectively applying a control current to said second conductor for producing a magnetic field at each of said locations to render corresponding segments of said first conductor non-superconductive, and superconducting means adjacent said first conductor for confining said field to thus decrease the inductance of said second conductor, whereby the impedance of said first conductor is switched from zero to a predetermined value.

6. A superconducting switching device comprising, a first superconducting conductor having a current flowing therethrough, means for applying a magnetic field only at predetermined points on said first conductor for rendering each of said predetermined points non-superconductive, and superconducting means restricting the volume occupied by said field to thereby reduce the time required to render said first conductor non-superconductive, whereby said current produces a voltage drop in said first conductor when said points of the latter are switched from the superconductive to the normal state.

7. A superconducting switching device comprising, first and second conductors each formed as a thin film of superconducting material, said second conductor traversing said first conductor only at predetermined points on the latter, said second conductor having a narrower width than said first conductor at each point of traversal, means for applying a current to said second conductor for rendering said first conductor non-superconductive only at said points of traversal and superconducting means adjacent said first and second conductors for decreasing the inductance of said second conductor, thereby decreasing the switching time of said device.

8. A superconducting switching device comprising, a first superconductive conductor formed as a thin film and having a current flowing therethrough, a second superconductive conductor formed as a thin film, said second conductor being magnetically coupled only at predetermined points to said first conductor, means for selectively applying a control current to said second conductor for applying a magnetic field to said first conductor at said predetermined points to render corresponding points of said first conductor non-superconducting, and a thin film of superconductive material for decreasing the inductance of said second superconductive conductor thus decreasing the switching time of said device, whereby said control current is effective to control the current in asid first conductor.

9. The device as claimed in claim 8 wherein said first and second conductors are substantially planar and are of unequal widths.

10. A superconductive switching device comprising; a first conductor fabricated as a thin flat ribbon of superconductive material; means for applying an electrical current to said first conductor; a second conductor fabricated as a thin flat ribbon of superconductive material having a higher critical field value than said first conductor, said second conductor being substantially narrower than said conductor; means for selectively applying a current to said second conductor thereby creating a magnetic field; a film of superconductive material disposed adjacent said first conductor for confining said field to thereby decrease the inductance of said second conductor; said second conductor being oriented with respect to said first conductor so that said magnetic field is applied to a plurality of segments of said first conductor thereby rendering each of said segments non-superconductive, whereby the current gain of said device is substantially the ratio of the widths of said first and second conductors so that a current in said second conductor is capable of controlling a relatively larger current in said first conductor.

11. The invention as claimed in claim 10 including a superconducting surface oriented adjacent said first and second conductors for confining said magnetic field to a smaller volume than normally occupied thereby in free space, whereby the inductance of said second conductor is substantially reduced.

12. A superconducting switching device comprising, a first superconductive conductor formed as a substantially planar thin film, a second superconductive conductor formed as a substantially planar thin film for applying a magnetic field to said first conductor to render the latter non-superconductive, and means for limiting the volume occupied by said field whereby the inductance of said second conductor is substantially reduced below the value thereof in free space.

13. A superconducting switching device comprising, a first superconductive conductor formed as a thin film having a predetermined width, a second superconductive conductor formed as a thin film having a predetermined width less than said first conductor, and a superconducting surface juxtaposed with said first and second conductors for decreasing the inductance of said conductors thereby decreasing the switching time of said device, whereby said device exhibits a current gain related to the rato of the the widths of said first and second conductors.

14. A superconductive gating device comprising, a superconductive surface oriented in a first plane, a first superconductive conductor formed as a flat ribbon and oriented in a second plane parallel to said first plane, a second superconductive conductor formed as a flat ribbon for applying a magnetic field to said first conductor, said superconducting surface substantially confining said field between said surface and said second superconductive conductor, and means for selectively applying electrical currents to both said conductors, whereby the application of said field to said first conductor renders the latter non-superconductive thereby impeding current flow therethrough.

15. A two-state superconductive device comprising; a first superconductive conductor; means for applying a current to said first conductor; a second superconductive conductor disposed adjacent said first conductor; and means for applying a current to said second conductor to render said first conductor non-superconductive; whereby the resistance of said first conductor is changed from zero to a predetermined value thereby controlling current flow in said first conductor; and a thin film of superconductor material arranged in sufficiently close proximity to said conductors to appreciably reduce the inductance of said conductors.

16. A superconductive gating device comprising; a first superconductive conductor; a second superconductive conductor having a critical field value greater than said first conductor; each of said conductors having a width appreciably greater than its thickness; the longitudinal axis of said second conductor being oriented to traverse the longitudinal axis of said first conductor; and means for applying electrical currents to said first and second conductors; whereby the current in said second conductor produces a magnetic field which controls current flow in said first conductor by controlling the superconductive characteristics of the latter; and a superconducting surface having a critical field value greater than said first conductor serving to restrict the volume occupied by said field whereby the inductance of said second conductor is substantially reduced below the value thereof in free space.

17. A superconductor switching device comprising; a gate film of superconductive material laid down on a substantially planar substrate; a thin control film of superconductive material laid down upon said planar substrate in magnetic field applying relationship to said gate film; whereby said gate film is controllable between superconductive and resistive states in response to current applied to said control film; and a layer of superconductive material laid down upon said planar substrate forming a shield for substantially reducing the inductance of said gate and control conductors.

18. A superconductor switching device comprising; a gate film having a width substantially greater than its thickness; a gate film of superconductor material having a width substantially greater than its thickness traversing said gate film and having a narrower width at the point of traversal for controlling said gate film between superconductive and resistive states; and a superconductor shield in close proximity to said gate and control films for reducing the inductance thereof.

19. A superconductor circuit comprising gate conductor means including a plurality of gate conductor segments; control conductor means including a plurality of control conductor segments; means connecting said control and gate conductor segments; current supply means for supplying current to said control and gate conductor segments; each of said segments having a width substantially greater than its thickness; each of said control conductor segments being arranged to traverse a corresponding one of said gate conductor segments and being narrower at the point of traversal than the traversed gate conductor segment; whereby the current required in each of said control segments to drive the corresponding gate segment resistive in the absence of current in the gate segment is less than the current required in the corresponding gate segment to drive itself resistive in the absence of current in the control segment.

20. The circuit of claim 19 wherein there is provided a superconductor shield in sufficiently close proximity to said circuit to substantially reduce the inductance therof.

21. A superconducting switching device comprising; a superconductor surface; a superconductive gate conductor disposed adjacent said surface; a superconductive control conductor for applying magnetic fields to said gate conductor to cause said gate conductor to be switched between the superconductive and normal states; said superconductive surface being arranged sufficiently close to said control and gate conductors to appreciably reduce the inductance of said control conductor and to confine the magnetic field thereof to the vicinity of said gate conductor.

22. Apparatus for representing information as the presence or absence of the superconducting state comprising; a superconducting member capable of being switched to the normal state, a control conductor adjacent said member for applying a magnetic field thereto to switch said member from the superconductive to the normal state, and superconducting means arranged in sufficiently close proximity to said control conductor to appreciably reduce the inductance of said control conductor.

23. A two-state switching device comprising; a superconducting element; a control member for applying a magnetic field to said element for switching the latter from the superconductive to the non-superconductive state; and a thin film superconducting shield arranged in sufficiently close proximity to said control member to appreciably reduce the inductance of said control member.

24. A superconductor switching device comprising: a first substantially planar superconductive conductor having a width substantially greater than its thickness; a second substantially planar superconductive conductor having a width substantially greater than its thickness for applying a magnetic field to said first conductor to render the latter non-superconductive, and a substantially planar superconductive shield arranged in close proximity to said conductors to appreciably reduce the inductance of said second conductor.

25. A superconductor switching device comprising; a first superconductive conductor having a width substantially greater than its thickness; a second superconductive conductor having a width substantially greater than its thickness for applying a magnetic field to said first conductor to render the latter non-superconductive; means for applying a current to be controlled to said first conductor and a control current to said second conductor; and a superconductive shield mounted in close proximity to said first and second conductors to appreciably reduce the inductance of said conductors below the value thereof in free space.

26. The device of claim 25 wherein said first and second conductors and said superconductive shield comprise thin films of superconductive material laid down one above the other on a substantially planar substrate with layers of insulating material interposed therebetween.

27. A superconductor switching device comprising; a first superconductive conductor having a width substantially greater than its thickness; a second superconductive conductor having a width substantially greater than its thickness for applying a magnetic field to said first conductor to render the latter non-superconductive; means for applying a current to be controlled to said first conductor and a control current to said second conductor; and a superconductive shield for limiting the volume occupied by the field produced by current in said second conductor whereby the inductance of said second conductor is substantially reduced below the value thereof in free space; the longitudinal axis of said second conductor traversing the longitudinal axis of said first conductor and the width of said second conductor being less than the width of said first conductor at the point of traversal.

28. A superconductive gating device comprising; a first walled thin superconducting cylinder, first means for applying a magnetic flux to the outer surface of said cylinder for rendering the latter non-superconductive, and flux excluding means mounted within said cylinder for excluding flux from within said cylinder when said first means is energized.

29. A high speed superconductor gating device comprising; a gate conductor in the form of a substantially planar thin film of superconductor material having a width appreciably greater than its thickness; and control conductor means including at least a single control conductor segment in the form of a second substantially planar thin film of superconductor material having a width appreciably greater than its thickness and arranged on one side of said gate conductor in magnetic field applying relationship to said gate conductor; said single control conductor segment being arranged in close proximity to said gate conductor and being narrower than said gate conductor so that the critical current required in said gate conductor to drive said gate conductor from a superconductive to a resistive state in the absence of current in said single control conductor segment is greater than the critical current required in said single control conductor segment to drive said gate conductor from a superconductive to a resistive state in the absence of current in said gate conductor.

30. A high speed superconductor gating device comprising; a gate conductor in the form of a substantially planar thin film of superconductor material and a control conductor including at least a single control conductor segment in the form of a second substantially thin film of superconductor material arranged on one side of said gate conductor with its longitudinal axis traversing the longitudinal axis of said gate conductor; said single control conductor segment being arranged in close proximity to said gate conductor and being narrower than said gate conductor at the point of traversal so that the critical current required in said gate conductor to drive said gate conductor from a superconductive to a resistive state in the absence of current in said single control conductor is greater than the critical current required in said single control conductor segment to drive said gate conductor from a superconductive to a resistive state in the absence of current in said gate conductor.

31. An electrical circuit element comprising, in combination, a control conductor, a gate conductor in close proximity thereto being superconductive at the temperature of operation of said element in the absence of an applied magnetic field and capable of transition to a state of resistivity under the influence of the magnetic field produced by current flowing in said control conductor, a core, said gate conductor being disposed about said core in the form of a thin walled elongated shell, to increase the resistance of said gate conductor and thereby reduce the time constant of said element, wherein said core includes a portion which is superconductive and is of material which requires a stronger magnetic field to render it resistive than does said gate conductor, whereby said portion may remain superconductive throughout operation of said element, thereby to decrease the inductance of said control conductor, said portion being electrically insulated from said gate conductor.

32. An electrical circuit element comprising, in combination, a control conductor, a gate conductor associated therewith which is superconductive at the temperature of operation of said element in the absence of an applied magnetic field and which is in close proximity thereto so as to be rendered resistive by the influence of the magnetic field produced by current flowing in said control conductor, said gate conductor being in the form of a thin walled shell to increase its resistivity, and an object disposed within said shell and having a surface substantially coextensive with the inner periphery thereof, said object containing material which is superconductive at the temperature of operation of said element when no magnetic field is applied thereto and which requires the application of a stronger magnetic field to render it resistive than does said gate conductor, whereby current flowing through said control conductor may render said gate conductor resistive while leaving said object superconductive, thereby to minimize the inductance of said control conductor and decrease the time constant of said element.

33. The combination defined in claim 32 which includes a thin layer of insulation between said object and said shell.

34. The combination defined in claim 32 in which said shell has a substantially cylindrical figuration and in which said object has a corresponding configuration to interfit therewith.

35. The combination defined in claim 32 in which the superconductive material in said object is in the form of a ring.

36. An electrical circuit element comprising, in combination, a control conductor, a gate conductor associated therewith which is superconductive at the temperature of operation of said element in the absence of an applied magnetic field and which may be rendered resistive under the influence of a magnetic field produced by current flowing in said control conductor, said gate conductor being in the form of a thin walled hollow cylinder to thereby increase its resistance, a core disposed within said gate conductor and insulated therefrom, said core being of a material which is normally superconductive at the temperature of operation of said element and which requires a stronger magnetic field to render it resistive than does said gate conductor, whereby it may remain superconductive throughout operation of said element, said control conductor being in the form of a coil wound about said cylinder, whereby the inductance of said coil is minimized to thereby decrease the time constant of said element.

37. The combination defined in claim 36 in which said gate conductor is of tantalum and said core is of niobium.

38. An electrical circuit element comprising a first superconductive body of predetermined width and length and adapted to be connected in an electrical circuit, a second superconductive body of at least substantially the same length and width and having a substantial surface area facing and disposed closely adjacent the first said body to control a magnetic field about the first body induced by current through the first body and current carrying inductive means for applying a magnetic field to the first body.

38. An electircal circuit element comprising a first superconductive body of predetermined width and length and adapted to be connected in an electrical circuit, and a second superconductive body of at least substantially the same length and width and having a substantial surface area facing and disposed closely adjacent the first said body to control a magnetic field about the first body induced by current through the first body, said second body having a higher critical field value than said first body below the critical temperature of the first body.

40. An electrical circuit element comprising a first superconductive body of predetermined width and length, said body being adapted to conduct current through a portion thereof and thereby induce a magnetic field around the body, and a second superconductive body having a surface at least substantially as long as and wider than said first body portion, said surface being disposed closely adjacent and facing said first body, and being adapted to substantially modify the field around said first body.

41. An electrical transmission device comprising an elongate superconductive element of predetermined width and length adapted to carry electrical current and induce a magnetic field about itself, said element having at a given temperature a super current capacity limited by its self field, and a superconductive body having a surface at least substantially as long as and wider than said element, said surface being disposed closely adjacent and facing said element, and said body being composed of a superconductive material which is normally superconductive at said given temperature, thereby to modify the field around said element substantially.

42. An electrical circuit device comprising a first superconductive body of predetermined width and length, said body being adapted to conduct current through a portion thereof and thereby induce a magnetic field around the body, and a second superconductive body having a surface at least substantially as long as and wider than said first body portion, said surface being disposed closely adjacent and facing said first body, said second body having a threshold field value at least as high as said first body below the critical temperature of the first body.

43. An electrical circuit device comprising a first superconductive body of predetermined width and length, said body being adapted to conduct current through a portion thereof and thereby induce a magnetic field around the body, and a second superconductive body having a surface at least substantially as long as and wider than said first body portion, said surface being disposed closely adjacent and facing said first body, and being adapted to substantially modify the field around said first body, the second body being isolated from any electrical current source.

44. An electrical circuit device comprising a layer of superconductive material, at least one superconductive path of generally rectangular cross section disposed close to and insulated from said layer, said path being adapted to conduct a current and induce a self field around the path, and said layer modifying the field around said path, thereby to increase its current carrying capacity.

45. An electrical circuit device comprising a layer of superconductive material, at least one superconductive gate of generally rectangular cross section disposed close to and insulated from said layer, and a control conductor disposed on the same side of said layer as said gate and adapted to apply a controlling magnetic field to said gate to cause transition of said gate between superconducting and finite resistance state, said gate being adapted to conduct a current and induce a self field around the gate, and said layer modifying the field around said gate, thereby to increase its current carrying capacity.

46. An electrical transmission device comprising an elongate superconductive conductor element having current terminals at each end thereof, said element being of predetermined width and length adapted to carry electrical current and induce a magnetic field about itself, and said element having at a given temperature a super current capacity limited by its self field, and a superconductive body having a surface at least substantially as long as and wider than said element, said surface being disposed closely adjacent and facing said element throughout said predetermined length between said terminals, and said body being composed of a superconductive material which is normally superconductive at said given temperature, thereby substantially to modify the field around said element and increase its current carrying capacity throughout said predetermined length between said terminals.

47. An electric circuit element comprising a sheet of superconductive material, a body of superconductive material and insulated from said sheet, said body being of predetermined length and width and said sheet being of at least substantially the same length and width, and said sheet having a surface closely spaced adjacent and substantially parallel to said body, said surface having an area substantially greater than said body facing said body thereby to control a magnetic field induced about said body by current through the body.

48. An electrical current element comprising a layer of superconductive material, an insulative coating over said layer and a film of superconductive material on said coating, said layer having substantial surface area facing and being at least coextensive with a portion of said film to control a magnetic field induced between said layer and film portion by current through said film.

References Cited

UNITED STATES PATENTS

| | | | |
|---|---|---|---|
| 2,666,884 | 1/1954 | Ericsson et al. | 307—88.5 |
| 2,832,897 | 4/1958 | Buck | 340—173 |
| 2,936,435 | 5/1960 | Buck | 340—173.1 |

OTHER REFERENCES

The Cryotron—A Superconductive Computer Component. Buck. Proceedings of the IRE. April, 1956, pages 482–493.

RICHARD M. WOOD, *Primary Examiner.*

EDWIN R. REYNOLDS, R. R. WINDHAM, M. U. LYONS, MAX L. LEVY, *Examiners.*

J. P. VANDENBURG, N. N. KUNITZ, W. M. ASBURY, H. T. POWELL, *Assistant Examiners.*